United States Patent [19]

Sakai

[11] 4,288,755

[45] Sep. 8, 1981

[54] PROTECTIVE CIRCUIT FOR A DIRECT-COUPLED AMPLIFIER

[75] Inventor: Kazumasa Sakai, Tokyo, Japan

[73] Assignee: TRIO Kabushiki Kaisha, Tokyo, Japan

[21] Appl. No.: 64,434

[22] Filed: Aug. 7, 1979

[30] Foreign Application Priority Data

Aug. 18, 1978 [JP] Japan .......................... 53-113365[U]

[51] Int. Cl.$^3$ ......................... H02N 7/20; H03F 3/04; H03F 21/06
[52] U.S. Cl. ............................... 330/298; 330/207 P; 361/79; 361/89
[58] Field of Search .............. 330/298, 207 P; 361/89, 361/79

[56] References Cited

U.S. PATENT DOCUMENTS 4,216,517 8/1980 Takahashi ............................ 361/79

*Primary Examiner*—Alfred E. Smith
*Assistant Examiner*—T. N. Grigsby
*Attorney, Agent, or Firm*—Lowe, King, Price & Becker

[57] ABSTRACT

A low pass filter is connected to a junction of a direct-coupled amplifier. The amplifier has a single-ended push-pull output stage consisting of two output transistors and series-connected two resistors. The output transistors are connected to a positive and negative d-c power sources, respectively. The series-connected two resistors are interposed between the two output transistors and defines an intermediate point therebetween at which substantially zero d-c voltage prevails when the amplifier is functioning normally. The junction of the amplifier, to which the low pass filter is connected, is between one of the output transistors and the series-connected resistors. The low pass filter is supplied with the voltage at the junction and applies its output to following isolating means. The means responds to the output of the low pass filter for isolating the intermediate point from a load device connected thereto.

6 Claims, 5 Drawing Figures

PROTECTIVE CIRCUIT FOR A DIRECT-COUPLED AMPLIFIER

BACKGROUND OF THE INVENTION

This invention relates to a protective circuit, and more specifically to a protective circuit for a direct-coupled amplifier and also for a load device coupled to the amplifier.

It is a usual practice to provide a direct-coupled amplifier with a protective circuit for protecting a load device, such as a loudspeaker, connected to the amplifier from being damaged due to d-c (direct current) voltage deviation at the intermediate point of the amplifier, and also for protecting output transistors of the amplifier from being damaged due to excessive currents caused by short-circuiting of output terminals of the amplifier or its load device.

A conventional protective circuit will now be described with reference to FIG. 1 of the accompanying drawings. A direct-coupled amplifier 1 comprises output transistors 2 and 3, and resistors 10 and 14, which constitute a single-ended push-pull output stage. The collectors of the transistors 2 and 3 are respectively connected to a positive and negative d-c power sources (+B, −B), and the emitters thereof are connected through the series-connected resistors 10 and 14. The amplifier 1 is connected, through its intermediate point or junction A and its output terminal OUT, to a load device (not shown) such as a loudspeaker for driving same. The d-c level at the point A is substantially zero volt when the amplifier 1 is functioning normally.

The prior art of FIG. 1 is provided with two protective circuits. One is for protecting the load device from being damaged due to the d-c voltage deviation at the intermediate point A, and comprises a low pass filter 6 consisting of a resistor and a capacitor 5, an absolute value amplifier 7, a driver 8, and a relay 9 driven by the driver 8. If the d-c voltage at the point A deviates due to trouble or malfunction in the amplifier 1, then the low pass filter 6 receives the deviated d-c voltage through the resistor 4 directly coupled to the point A. The filtered output from the low pass filter 6 is fed to the driver 8 via the absolute value amplifier 7, and actuates the relay 9 for isolating the point A from the output terminal OUT by opening relay contacts 9-1. Thus, the load device can be protected from being damaged by the d-c deviation at the point A.

The other protective circuit of the prior art is denoted by a reference numeral 13, and comprises two transistors 11 and 12 and three resistors (no numerals). This protective circuit 13 detects the current from the transistor 2 by detecting the voltage across the resistor 10. If the current flowing through the transistor 2 abnormally increases due to short-circuiting of the load device, the protective circuit 13 detects the excessive current and actuates the relay 9 via the driver 8, thereby isolating the output transistors 2 and 3 from the output terminal OUT.

Thus it will be understood that as the prior art is provided with the two different protective circuits, one for protecting the load device and the other for protecting the output transistors. The prior art is complex and expensive even though the two protective circuits share the same driver 8 and relay 9.

SUMMARY OF THE INVENTION

It is therefore an object of this invention to provide a single protective circuit which can provide the functions of both of the protective circuits described hereinbefore and thus protects both the output transistors of the direct-coupled amplifier and the load device coupled thereto.

According to the protective circuit embodying this invention, a direct-coupled amplifier to be protected by this invention generally comprises: a positive and negative d-c power sources; two output transistors connected to the positive and negative d-c power sources, respectively; series-connected two resistors defining an intermediate point therebetween at which substantially zero voltage prevails when the direct-coupled amplifier is functioning normally, and being interposed between the two output transistors; and an output terminal interconnecting the intermediate point and a load device coupled to the amplifier. The protective circuit comprises a low pass filter connected to the junction between one of the output transistors and the series-connected resistors, and isolating means connected to the low pass filter for isolating the intermediate point from the output terminal in response to the output of the low pass filter.

BRIEF DESCRIPTION OF THE DRAWINGS

This invention will be further described by way of example with reference to the accompanying drawings, in which like parts in each of the several figures are identified by the same reference characters, and in which.

DETAILED DESCRIPTION OF THE INVENTION

Figure 1:
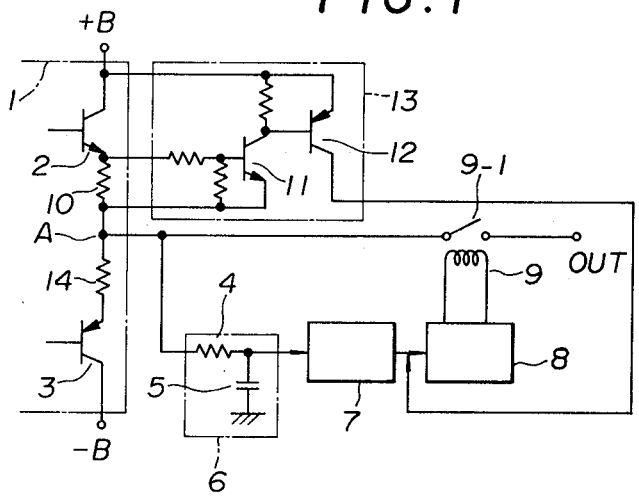
FIG. 1 is a schematic block diagram of the conventional protective circuit together with a portion of a direct-coupled amplifier to be protected.
Figure 2:
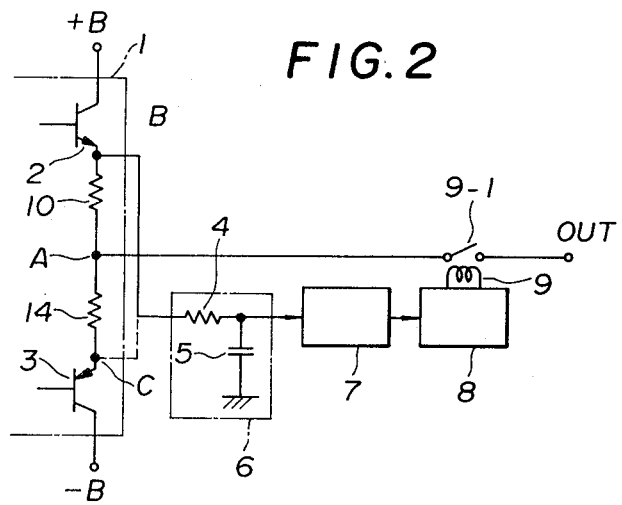
FIG. 2 is a schematic block diagram of a protective circuit embodying this invention and a portion of a direct-coupled amplifier to be protected.

Particular reference is made now to FIG. 2. The direct-coupled amplifier 1 of FIG. 2 has the same circuit configuration as that of FIG. 1, so further description thereof will be omitted for clarity. The protective circuit of this invention comprises a low pass filter 6 including a resistor 4 and a capacitor 5, an absolute value amplifier 7, a driver 8, and a relay 9 driven by the driver. The resistor 4 is connected to a junction B between the resistor 10 and the emitter of the transistor 2, receiving the potential developed thereat.

With this arrangement, if the d-c voltage at the intermediate point A deviates in a positive direction due to any trouble or malfunction in the output transistors 2 or 3, or other parts of the amplifier 1, then the d-c voltage at the junction B similarly deviates in the positive direction. Therefore, the deviated d-c voltage is filtered by the low pass filter 6, and is applied to the absolute value amplifier 7. The amplifier 7 amplifies the input voltage and produces an output having absolute value. The output from the amplifier 7 is then fed to the driver 8 which drives the relay 9. Thus, the relay contacts 9-1 opens with the result that the load device, such as a loudspeaker, is isolated from the amplifier 1. This means that the load device can be protected from excessive d-c flowing from the point A.

If the d-c voltage at the intermediate point A deviates in turn in the negative direction due to the aforementioned malfunction, the d-c voltage also deviates in the same direction. The deviated d-c voltage is filtered by the low pass filter 6, and then applied to the absolute value amplifier 7. Consequently, the output from the amplifier 7 enables the driver 8 to drive the relay 9, thereby protecting the load device by breaking the connection between the amplifier 1 and the load device.

Figure 3:
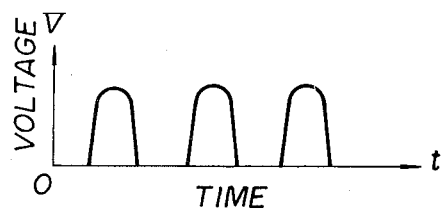
FIG. 3 is a voltage waveform derived from a portion of the circuit of FIG. 2 in case of malfunction in the amplifier.

On the other hand, if the output terminal OUT or the load device is short-circuited, the terminal OUT is grounded. As a result, the current flowing through the transistors 2 and 3 abruptly increases so that the voltage across the resistor 10 pulsates as shown in FIG. 3. This pulsating voltage is applied to the low pass filter 6 which supplies a smoothed d-c voltage to the next stage, viz., the absolute value amplifier 7. Upon receiving the output from the amplifier 7, the driver 8 causes the relay 9 to open its contacts 9-1. Thus, the output transistors 2 and 3 are duly protected from being irreversibly damaged due to excessive currents flowing therethrough.

The low pass filter 6 can be alternatively connected to a junction C between the resistor 14 and the collector of the transistor 3, as shown by a broken line in FIG. 2. In this case, the protective circuit of this invention functions in the same manner as previously mentioned.

It should be noted that while the amplifier operates normally, the protective circuit is not adversely affected by an a-c (alternating current) voltage at the junction B or C, because the a-c component is blocked by the filter 6.

The minimum d-c voltage from the filter 6 for actuating the amplifier 7 is usually used as a threshold level of the protective circuit of FIG. 2. However, a comparator (not shown) may be inserted between the amplifier 7 and the driver 8 for comparing the output from the amplifier 7 with a reference level in order that the driver 8 is energized only when the output from the amplifier 7 exceeds the reference level.

Figure 4:
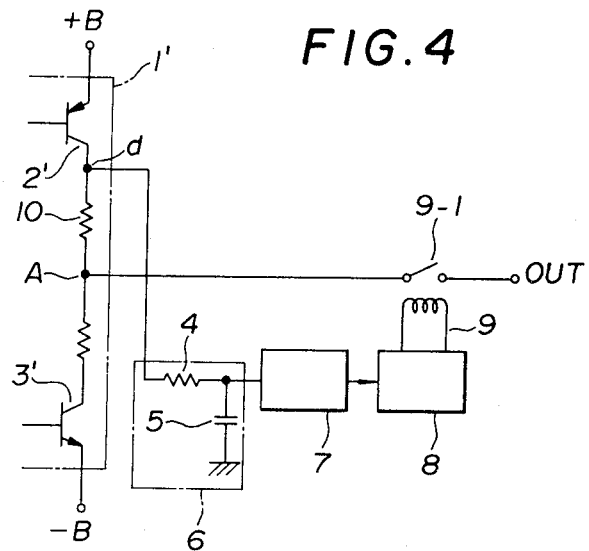
FIGS. 4 and 5 each is a schematic block diagram of another protective circuit embodying this invention and a portion of a direct-coupled amplifier to be protected.

FIG. 4 illustrates another embodiment of this invention. The only difference between the two embodiments of FIGS. 2 and 4 is that the NPN and PNP transistors 2 and 3 of FIG. 2 are replaced by a PNP and NPN transistors 2' and 3', respectively. The operation of the circuit of FIG. 4 is, therefore, the same as that of FIG. 2 so that a detailed description thereof will be omitted for brevity.

Figure 5:
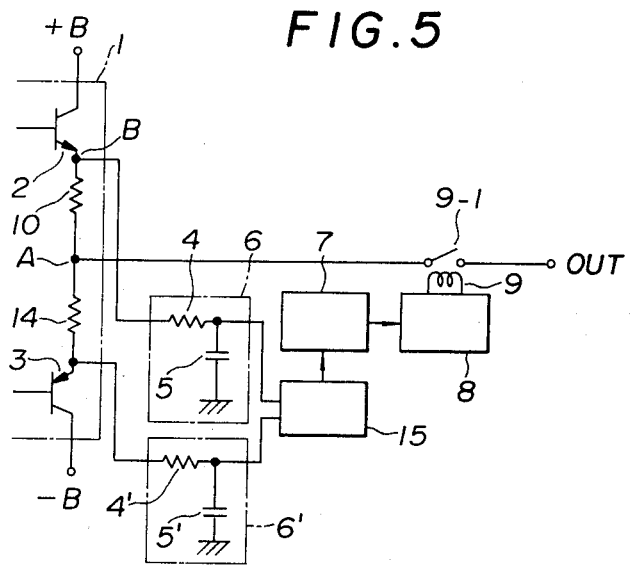

FIG. 5 illustrates still another embodiment of this invention, wherein a differential amplifier 15 is connected to the two junctions B and C by way of the low pass filter 6 and a newly added low pass filter 6' including a resistor 4' and a capacitor 5', respectively. The differential amplifier 15 produces an output proportional to the difference between the d-c voltages applied to the two filters 6 and 6'.

While a particular embodiment of the invention has been shown and described, it will be obvious to those skilled in the art that changes and modification may be made without departing from the invention in its broader aspects, and therefore, it is intended in the appended claims to cover all such modifications and changes as may fall within the true spirit and scope of the invention.

What is claimed is:

1. A protective circuit for a direct-coupled amplifier and for a load device connected to said direct-coupled amplifier, said direct-coupled amplifier comprising:
   a positive and a negative power sources;
   two output transistors connected to said positive and negative power sources, respectively;
   series-connected two resistors defining an intermediate point therebetween at which substantially zero voltage prevails when said direct-coupled amplifier is functioning normally, and being interposed between said two output transistors; and
   an output terminal interconnecting said intermediate point and said load device;
   said protective circuit comprising:
   a low pass filter connected to the junction between one of said output transistors and said series connected two resistors; and
   means connected to said low pass filter for isolating said intermediate point from said output terminal in response to the output of said low pass filter.

2. A protective circuit as claimed in claim 1, wherein said means comprises an absolute value amplifier connected to said low pass filter, a driver connected to said absolute value amplifier and an isolating device connected to and driven by said driver in response to the output of said driver for isolating said intermediate point from said output terminal.

3. A protective circuit as claimed in claim 2, wherein said isolating device is a relay the contacts of which are provided between said intermediate point and said output terminal.

4. A protective circuit for a direct-coupled amplifier and for a load device connected to said direct-coupled amplifier, said direct-coupled amplifier comprising:
   a positive and a negative power sources;
   two output transistors connected to said positive and negative power sources, respectively;
   series-connected two resistors defining an intermediate point therebetween at which substantially zero voltage prevails when said direct-coupled amplifier is functioning normally, and being interposed between said two output transistors; and
   an output terminal interconnecting said intermediate point and said load device;
   said protective circuit comprising:
   a first low pass filter connected to the junction between one of said output transistors and said series-connected two resistors;
   a second low pass filter connected to the junction between the other of said output transistors and said series-connected two resistors;
   a differential amplifier having two inputs connected to the output of said first and second low pass filters, respectively; and
   means connected to the output of said differential amplifier for isolating said intermediate point from said output terminal in response to the output of said differential amplifier.

5. A protective circuit as claimed in claim 4, wherein said means comprises an absolute value amplifier connected to said differential amplifier, a driver connected to said absolute amplifier, and an isolating device connected to and driven by said driver in response to the output of said driver for isolating said intermediate point from said output terminal.

6. A protective circuit as claimed in claim 5, wherein said isolating device is a relay the contacts of which are provided between said intermediate point and said output terminal.

* * * * *